US007205910B2

(12) United States Patent
Honma et al.

(10) Patent No.: US 7,205,910 B2
(45) Date of Patent: Apr. 17, 2007

(54) SIGNAL ENCODING APPARATUS AND SIGNAL ENCODING METHOD, AND SIGNAL DECODING APPARATUS AND SIGNAL DECODING METHOD

(75) Inventors: Hiroyuki Honma, Chiba (JP); Jun Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 327 days.

(21) Appl. No.: 10/492,677

(22) PCT Filed: Jul. 29, 2003

(86) PCT No.: PCT/JP03/09613

§ 371 (c)(1),
(2), (4) Date: Apr. 15, 2004

(87) PCT Pub. No.: WO2004/019497

PCT Pub. Date: Mar. 4, 2004

(65) Prior Publication Data

US 2004/0247037 A1 Dec. 9, 2004

(30) Foreign Application Priority Data

Aug. 21, 2002 (JP) ............................ 2002-241052

(51) Int. Cl.
*H03M 7/00* (2006.01)

(52) U.S. Cl. ............................ 341/50; 381/61; 381/98; 381/94.2; 381/94.3; 704/204; 704/205; 704/500

(58) Field of Classification Search .................. 341/50; 700/94; 704/204–205, 227, 500, 229–230
See application file for complete search history.

(56) References Cited

U.S. PATENT DOCUMENTS 5,264,846 A * 11/1993 Oikawa ....................... 341/76
5,294,925 A * 3/1994 Akagiri ....................... 341/50
5,530,750 A * 6/1996 Akagiri ....................... 704/500
5,765,127 A * 6/1998 Nishiguchi et al. ......... 704/208
6,167,375 A * 12/2000 Miseki et al. ............... 704/229

(Continued)

FOREIGN PATENT DOCUMENTS

JP 10-126272 5/1998

(Continued)

*Primary Examiner*—Khai M. Nguyen
(74) *Attorney, Agent, or Firm*—Sonnenschein Nath & Rosenthal LLP

(57) ABSTRACT

A signal encoding apparatus (10) limits an inputted time series signal to a low frequency band signal having a certain cut-off frequency or less to include the low frequency band signal into code train for outputting encoded low frequency band code train. In addition, the signal encoding apparatus (10) adaptively determines aliasing frequency $f_a$, shift frequency $f_{sh}$ or tone•noise synthesis information r used for generation of high frequency band signal at the decoding side to include these information into code train outputted along with high frequency band spectrum envelope information as high frequency band generation information. A signal decoding apparatus generates a high frequency band signal from a low frequency band signal by using high frequency band signal generation information included in code train and high frequency band spectrum envelope to add the generated high frequency band signal and the low frequency band signal to thereby output a time series signal extended up to the high frequency band signal.

15 Claims, 13 Drawing Sheets

U.S. PATENT DOCUMENTS

| | | | | |
|---|---|---|---|---|
| 6,829,360 | B1 | 12/2004 | Iwata et al. | |
| 6,922,667 | B2 * | 7/2005 | Tsushima et al. | 704/219 |
| 2003/0088328 | A1 * | 5/2003 | Nishio et al. | 700/94 |
| 2003/0093271 | A1 * | 5/2003 | Tsushima et al. | 704/230 |
| 2003/0158726 | A1 | 8/2003 | Collen et al. | |

FOREIGN PATENT DOCUMENTS

| | | |
|---|---|---|
| JP | 2003-108197 | 4/2003 |
| JP | 2003-140692 | 5/2003 |
| JP | 2003-186499 | 7/2003 |
| JP | 2003-216190 | 7/2003 |
| JP | 2003-228399 | 8/2003 |
| WO | WO1998/57436 | 12/1998 |
| WO | WO 00/70769 | 11/2000 |
| WO | WO2001/80223 | 10/2001 |
| WO | WO2002/058052 | 7/2002 |
| WO | WO 03/038812 | 5/2003 |
| WO | WO 03/042979 | 5/2003 |

* cited by examiner

SIGNAL ENCODING APPARATUS AND SIGNAL ENCODING METHOD, AND SIGNAL DECODING APPARATUS AND SIGNAL DECODING METHOD

BACKGROUND OF THE INVENTION

The present invention relates to a signal encoding apparatus and a method therefor, a signal decoding apparatus and a method therefor, a program and a recording medium which are suitable when used in the case where time series signal limited to frequency band which is the encoding side is extended to signal in broader frequency band at the decoding side.

This Application claims priority of Japanese Patent Application No. 2002-241052, field on Aug. 21, 2002, the entirety of which is incorporated by reference herein.

In recent years, in efficient encoding of audio signal, mechanism of auditory sense of the human being is utilized to thereby have ability to compress data quantity having sound quality corresponding to CD (Compact Disk) into data quantity of about 1/10 of the original CD. At present, goods utilizing theses technologies are circulated also on the market, and it is realized that audio signals are recorded on smaller recording media, and/or are distributed (delivered) through network.

In such efficient compression, individual formats are respectively employed. If corresponding format is within the range of format, it is possible to freely control, to some degree, sound quality and bit rate at the encoding side. For example, also with respect to Mini Disk (MD) (Trade Mark by Sony Corporation), two modes of LP2 and LP4 using the same efficient compression technology exist as the long time recording mode. In the case of LP4, data is further compressed into one half with respect to LP2 to thereby permit recording time which is two times greater than that of LP2 while sound quality is inferior.

However, in such efficient compression technology, since design and standardization are made in the state where bit rate and sound quality are clearly determined as target, when bit rate is further lowered while maintaining standard (format), sound quality is extremely deteriorated. In order to avoid such circumstances, there is generally employed a method of performing improvement in efficient coding algorithm at the encoding side, or limiting signal in the high frequency band where auditory sense of human being is dull to distribute extra bits to signal in the lower frequency band.

Meanwhile, in the case where signal in the high frequency band is limited in order to maintain sound quality to lower bit rate while maintaining the format in a manner as described above, there is also a trial for reproducing signal in the high frequency band at the decoding side. For example, there are such a technology to double reproduction frequency band of PCM signal of 44.1 kHz sampling which is described in the Japanese Patent Publication Laid Open No. 1990-311006, and such a technology to extend frequency band of telephone at the receiving side which is described in the Japanese Patent Publication Laid open No. 1997-55778.

The technologies as stated above have the merit that change of format is not required so that it is sufficient to perform improvement only at the decoding side, but do not exhibit dramatic effect in point of sound quality because there is a necessity to extend the frequency band only from received signal, and are such that distortion from viewpoint of auditory sense is offensive to the ears in the high frequency band particularly in the case where there does not so exist correlation between low frequency band and high frequency band, etc. in dependency upon inputted sound source.

Moreover, in the above-described Japanese Patent Publication Laid Open No. 1997-55778, pitch analysis is performed at the time of decoding to add spectrum of frequency of multiple of n thereof to signal in the high frequency band to thereby extend frequency band of telephone at the receiving side. Since it is rare that plural pitches exist in the case of sound (speech) for telephone use, whereas there are many instances where plural pitches are included in the case of general audio signal, employment of such method is not effective, and there are many cases where pitch analysis does not function from the beginning.

On the other hand, in the case where format is extended so that band-limited reproduction is permitted to be performed in equipments which employ conventional format, and reproduction of high quality in which frequency band has been extended is permitted to be performed in equipments which employ new format, both change at the encoding side and that at the decoding side are required. In this case, result which is better than that by improvement only at the decoding side can be obtained. For example, in the technology for improving dynamic range and reproduction band of CD which is called HDCD, parameter such as filter kind, etc. for extending frequency band is hidden into the conventional format so that it is below audible level to thereby realize improvement in quality.

In addition, without being limited to such extension of format as described above, in mobile telephone and/or semiconductor recording equipment such as flash media, etc., it is desirable to have low bit rate and to have higher sound quality. Further improvement in performance by introducing new technology with respect to the existing Codec by waveform encoding is required.

SUMMARY OF THE INVENTION

The present invention has been proposed in view of such conventional actual circumstances, and its object is to provide a signal encoding apparatus and a method therefor which can generate optimum harmonic wave (higher harmonic) at a frequency band extended at the time of decoding even in the case where complicated harmonic wave exists, a signal decoding apparatus and a method therefor which decode code trains outputted from the signal encoding apparatus, a program for allowing computer to execute such signal encoding processing and signal decoding processing, and a computer readable recording medium where such program is recorded.

To attain the above-described object, in the signal encoding apparatus and the method therefor according to the present invention, in orthogonally transforming inputted time series signal to encode the time series signal thus transformed, spectrum of limit band corresponding to a predetermined frequency band of the inputted time series signal is encoded, and mapping information indicating a method of mapping is adaptively generated in order to determine time series signal of frequency band to be extended at the decoding side on the basis of mapping of spectrum of the limit band to output the encoded spectrum of the limit band and the mapping information.

Moreover, in order to attain the above-described object, in the signal decoding apparatus and the method therefor according to the present invention, encoded spectrum of limit band corresponding to a predetermined frequency band of a time series signal inputted at the encoding side, and mapping information indicating a method of mapping which has been adaptively generated in order to determine a time series signal of a frequency band to be extended at the decoding side on the basis of mapping of the spectrum of limit band are inputted to decode the encoded spectrum of limit band to generate a time series signal of limit band, and to determine, on the basis of the mapping information, spectrum of extension band to be extended from the spectrum of limit band to inverse-orthogonally transform the spectrum of the extension band to generate a time series signal of the extension band to add the time series signal of the limit band and the time series signal of the extension band to output added signal.

In accordance with the signal encoding apparatus and the method therefor, and the signal decoding apparatus and the method therefor which have been described above, spectrum of limit band corresponding to a predetermined frequency band of inputted time series signal is encoded at the encoding side, and mapping information indicating a method of the mapping is adaptively generated in order to determine time series signal of frequency band to be extended at the decoding side on the basis of mapping of the spectrum of the limit band. Further, at the decoding side, the encoded spectrum of the limit band is decoded to generate time series signal of limit band, and to generate, on the basis of the mapping information, time series signal of extension band to be extended from the spectrum of limit band on the basis of the mapping information to add the time series signal of the limit band and the time series signal of the extension band to output added signal.

In addition, the program according to the present invention serves to allow computer to execute the above-described signal encoding processing or signal decoding processing, and the recording medium according to the present invention is directed to computer readable recording medium where such program is recorded.

Still further objects of the present invention and practical merits obtained by the present invention will become more apparent from the description of the embodiments which will be given below.

BRIEF DESCRIPTION OF THE DRAWINGS

FIGS. 2A and 2B are views showing, in a model form, the state of normalization of spectrum at spectrum envelope analysis generating circuit of the signal encoding apparatus, wherein FIG. 2A shows spectrum envelopes of low frequency band signal and high frequency band signal, and FIG. 2B shows spectrum envelope of spectrum normalized on the basis of the spectrum envelope.

FIGS. 16A and 16B are views showing respective examples of formats of data trains in the conventional standard and the standard of this embodiment, wherein FIG. 16A shows data train of the conventional standard which has not extension data area, and FIG. 16B shows data train of the standard of this embodiment which has extension data area.

DETAILED DESCRIPTION OF THE PRESENTLY PREFERRED EMBODIMENTS

Explanation will be given below in detail with reference to the attached drawings in connection with practical embodiments to which the present invention is applied. In the embodiments, the present invention is applied to a signal encoding apparatus and a method therefor which limit inputted time series signal to low frequency band (low frequency band signal), and a signal decoding apparatus and a method therefor which extend that time series signal to high frequency band (high frequency band signal) by using mapping of low frequency band spectrum on the frequency axis, e.g., aliasing or shift (parallel displacement).

Simply speaking, in this embodiment, while limiting an inputted time series signal to a low frequency band signal having a predetermined cut-off frequency $f_c$ or less at the encoding side, aliasing frequency $f_a$ or shift frequency $f_{sh}$, etc. used for generation of high frequency band signal at the decoding side is adaptively determined. Further, at the decoding side, low frequency band spectrum on the frequency axis is caused to undergo aliasing symmetrically with aliasing frequency $f_a$ inputted from the encoding side being as center, or is shifted by $2f_c-f_{sh}$ on the basis of shift frequency $f_{sh}$ to generate a high frequency band signal on the basis of the spectrum which has been caused to undergo aliasing or the shifted spectrum.

Figure 1:
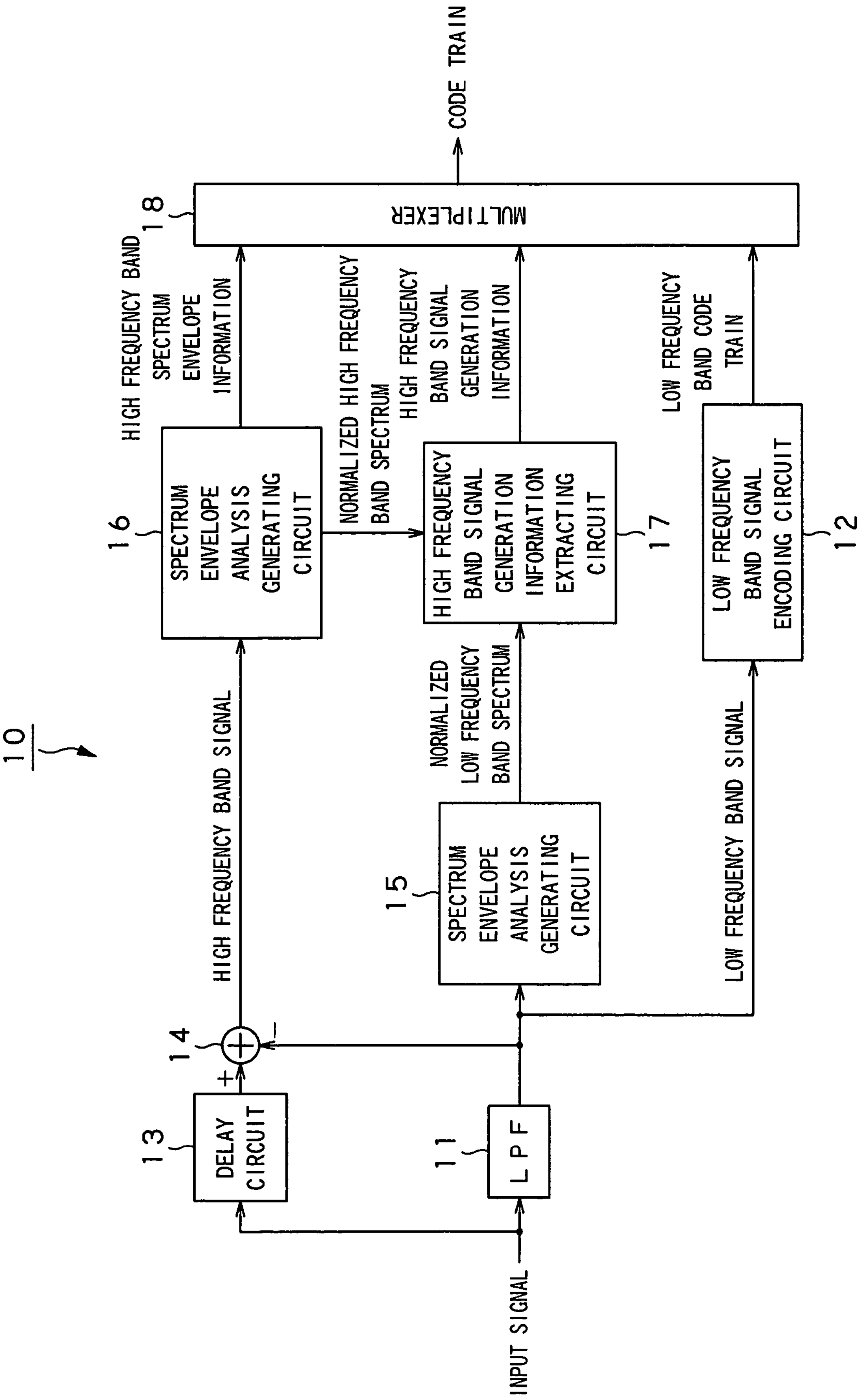
FIG. 1 is a view for explaining outline of the configuration of a signal encoding apparatus in this embodiment.

First, outline of the configuration of a signal encoding apparatus in this embodiment is shown in FIG. 1. As shown in FIG. 1, the signal encoding apparatus 10 in this embodiment is composed of a low-pass filter (LPF) 11, a low frequency band signal encoding circuit 12, a delay circuit 13, a difference circuit 14, spectrum envelope analysis generating circuits 15, 16, a high frequency band signal generation information extracting circuit 17, and a multiplexer 18.

The low-pass filter 11 limits an inputted time series signal to a low frequency band signal having a predetermined cut-off frequency $f_c$ or less to deliver this low frequency band signal to the low frequency band signal encoding circuit 12, the difference circuit 14 and the spectrum envelope analysis generating circuit 15.

The low frequency band signal encoding circuit 12 orthogonally transforms, every predetermined frame, low frequency band signal through the low-pass filter 11 to encode that signal to deliver the low frequency band code train thus obtained to the multiplexer 18.

The delay circuit 13 has the same delay time as that of the low-pass filter 11, and serves to take synchronization with the low frequency band signal which has been filtered at the low-pass filter 11 with respect to inputted time series signal thereafter to deliver this time series signal to the difference circuit 14.

The difference circuit 14 takes difference between the time series signal delivered from the delay circuit 13 and the low frequency band signal delivered from the low-pass filter 11 to generate a high frequency band signal. The difference circuit 14 delivers this high frequency band signal to the spectrum envelope analysis generating circuit 16.

The spectrum envelope analysis generating circuit 15 analyzes the delivered low frequency band signal to generate low frequency band spectrum envelope to deliver, to the high frequency band signal generation information extracting circuit 17, normalized low frequency band spectrum obtained by normalizing low frequency band spectrum by this low frequency band spectrum envelope.

Similarly, the spectrum envelope analysis generating circuit 16 analyzes high frequency band spectrum obtained by orthogonally transforming the delivered high frequency band signal every predetermined frame to generate high frequency band spectrum envelope to generate high frequency band spectrum envelope information for outputting the high frequency band spectrum envelope and normalized high frequency band spectrum obtained by normalizing the high frequency band spectrum by the high frequency band spectrum envelope. Further, the spectrum envelope analysis generating circuit 16 delivers the normalized high frequency band spectrum to the high frequency band signal generation information extracting circuit 17, and delivers the high frequency band spectrum envelope information to the multiplexer 18.

The high frequency band signal generation information extracting circuit 17 performs analysis on the basis of the normalized high frequency band spectrum and the normalized low frequency band spectrum to generate high frequency band signal generation information for generating high frequency band signal at the decoding side. Here, as this high frequency band signal generation information, tone•noise mixture information r ($0.0 \leqq r \leqq 1.0$) indicating tone characteristic and noise characteristic are mentioned in addition to aliasing frequency $f_a$ and shift frequency $f_{sh}$. This tone•noise mixture information r can be determined in accordance with the following formula (1) as described below within the range, e.g., from generation start frequency of normalized low frequency spectrum to termination frequency of normalized high frequency band spectrum. Here, in the formula (1), $S_{max}$ indicates the maximum value of spectrum and Save indicates average value of spectrum. In addition, A indicates a predetermined constant, $$r = A \times S_{max} / S_{ave} (0.0 \leqq r \leqq 1.0) \quad (1)$$

The multiplexer 18 collectively outputs, as one code train, low frequency band code train delivered from the low frequency band signal encoding circuit 12, high frequency band signal generation information delivered from the spectrum envelope analysis generating circuit 16, and high frequency band spectrum envelope information delivered from the high frequency band signal generation information extracting circuit 17.

Figure 2A:
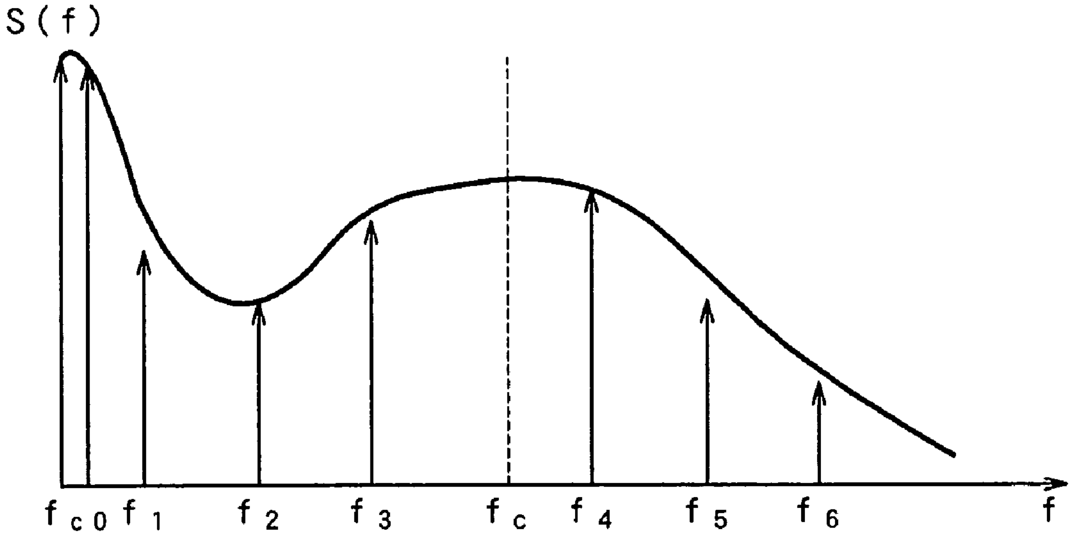
Figure 2B:
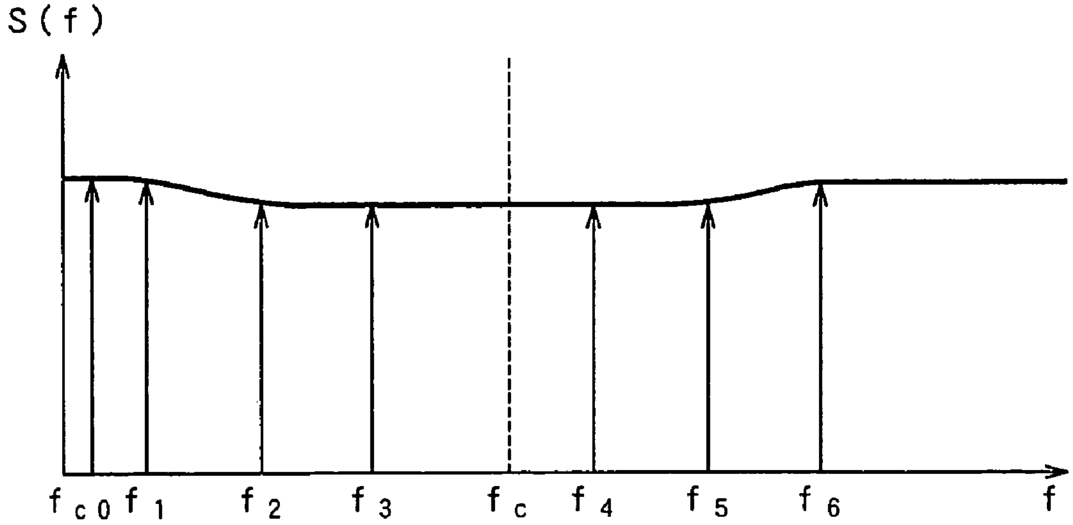

Here, the states of normalization of spectrum at the spectrum envelope analysis generating circuits 15, 16 are shown in FIGS. 2A and 2B in a model form. FIG. 2A shows, in combination, high frequency band spectrum envelope included in code train in the state where it is changed into parameter and low frequency band spectrum envelope prepared from low frequency band signal. In this case, $f_1$~$f_6$ in FIG. 2A indicate peak positions of spectrum, and $f_c$ indicates cut-off frequency of the low-pass filter 11 (FIG. 1). Spectrum is normalized on the basis of this spectrum envelope. Spectrum envelope of the normalized spectrum is shown in FIG. 2B In this way, spectrum is normalized by spectrum envelope to thereby have ability to determine aliasing frequency $f_a$ or shift frequency $f_{sh}$ in the state where weight is placed on the peak position of spectrum. Thus, accuracy of high frequency band signal generated at the decoding side can be improved. It is to be noted that in the case where restriction in processing time or hardware exists, processing of this normalization may be omitted in the state where accuracy is sacrificed.

Explanation will be given below in order in connection with the procedure for determining aliasing frequency $f_a$ or shift frequency $f_{sh}$ at the above-described high frequency band signal generation information extracting circuit 17 on the basis of the normalized low frequency band spectrum and the normalized high frequency band spectrum which have been described above.

Figure 3:
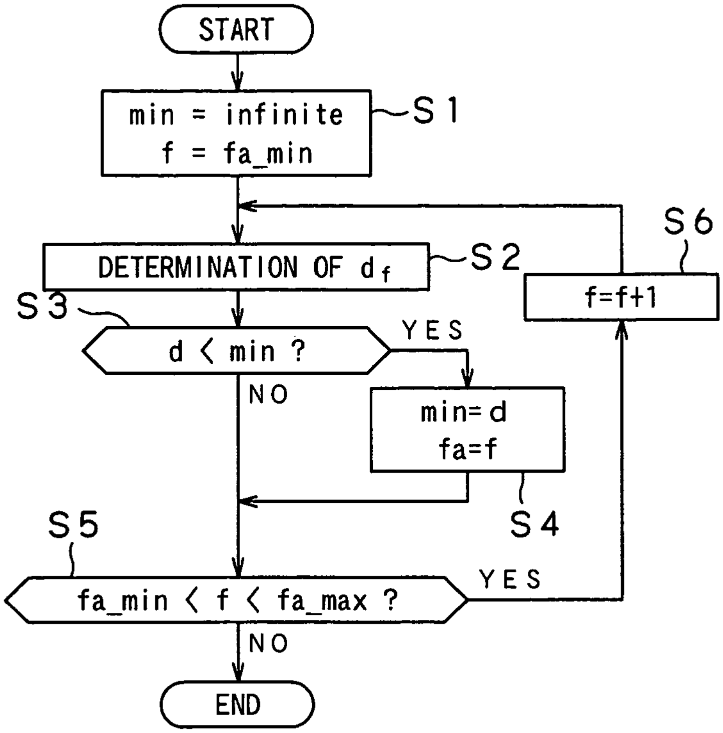
FIG. 3 is a flowchart for explaining the procedure which determines aliasing frequency at high frequency band signal generation information extracting circuit of the signal encoding apparatus.

First, explanation will be given by using the flowchart of FIG. 3 in connection with the procedure for determining aliasing frequency $f_a$ at the high frequency band signal generation information extracting circuit 17. Hereinafter, normalized high frequency band spectrum is expressed as F_high. Particularly, it is assumed that F_high(f) represents spectrum of frequency band higher than frequency f. Moreover, normalized low frequency band spectrum is expressed as F_low(f). Particularly, it is assumed that F_low'(f) represents spectrum obtained by allowing low frequency band spectrum F_low(f) less than frequency f to linearly symmetrically undergo aliasing with the frequency f being as center. In addition, fa_min and fa_max respectively indicate lower limit value and upper limit value of frequency serving as search range in determining aliasing frequency $f_a$. The fa_min and the fa_max may be fixed by standard, or may be arbitrarily set within the range of that standard by encoder.

First, at step S1, the minimum value min serving as internal variable is set to infinite value, and frequency f is set to fa_min as initial value.

Subsequently, at step S2, distance $d_f$ between vectors in the case where F_high(f) and F_low' (f) are respectively regarded as vector is calculated in accordance with the following formula (2). Here, in the formula (2), i indicates index of discrete frequency, and $n_f$ indicates the number of samples up to frequency f. In addition, S_low'(i) indicates magnitude of F_low'(f) at the discrete frequency i, and S_high(i) indicates magnitude of F_high(f) at the discrete frequency i.

$$df = \frac{\sum_{i=f}^{2f} |S\_low'(i) - S\_high(i)|^2}{n_f} \quad (2)$$

Figure 4:
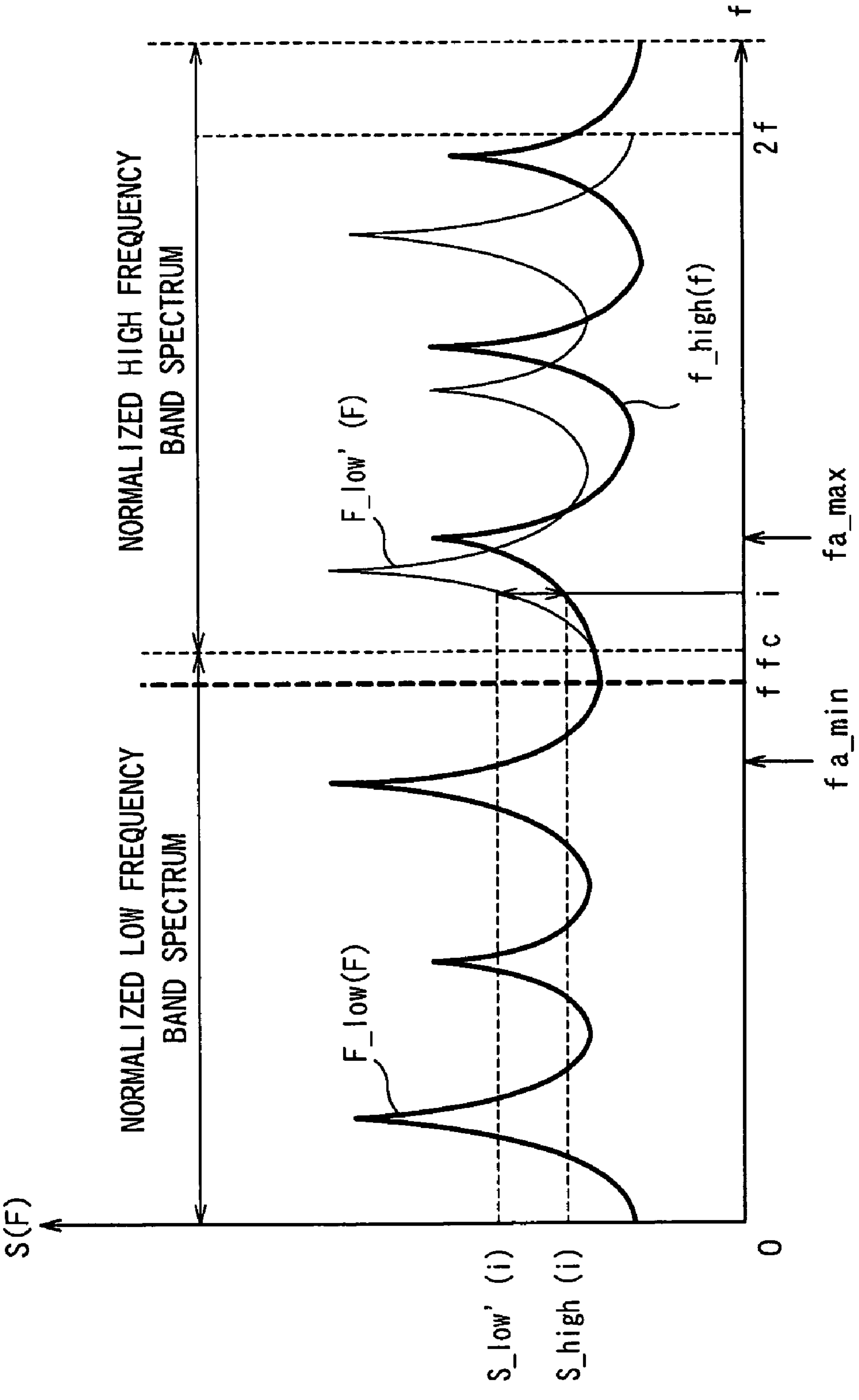
FIG. 4 is a view showing, in a model form, the state for determining aliasing frequency.

Namely, as indicated in a model form in FIG. 4, square of difference of magnitude (level) between F_low'(f) and F_high(f) (=|S_low'(i)−S_high(i)|$^2$) is cumulatively added with respect to the range from discrete frequency f to discrete frequency 2f to allow the added value thus obtained to be distance $d_f$.

Returning to FIG. 3 for a second time, at step S3, whether or not distance $d_f$ is less than the minimum value min is discriminated. In the case where the distance $d_f$ is less than the minimum value min (Yes), the minimum value min is updated into $d_f$ at the subsequent step S4 to preserve (store) frequency f at that time as aliasing frequency $f_a$. On the other hand, in the case where distance $d_f$ is the minimum value min or more (No), processing proceeds to step S5.

At the step S5, whether or not frequency f falls within the range from fa_min to fa_max is discriminated. In the case where the frequency f falls within the range from fa_min to fa_max (Yes), the frequency f is incremented at step S6 to return to the step S2. On the other hand, in the case where the frequency f does not fall within the range from fa_min to fa_max (No), aliasing frequency $f_a$ preserved (stored) at present is established to include the aliasing frequency $f_a$ thus established into the above-described high frequency band signal generation information.

Then, explanation will be given by using the flowchart of FIG. 5 in connection with the procedure for determining shift frequency $f_{sh}$ at the high frequency band signal generation information extracting circuit 17. Similarly to the above, normalized high frequency band spectrum is represented as F_high. Particularly, it is assumed that F_high(f) represents spectrum having frequency band higher than frequency f. Moreover, normalized low frequency band spectrum is represented as F_low. Particularly, it is assumed that F_low'(f) represents spectrum obtained by shifting low frequency band spectrum F_low(f) having frequency lower than frequency f by, e.g., $2f_c$−f. Further, $f_{sh}$_min and $f_{sh}$_max respectively indicate lower limit value and upper limit value of frequency serving as search range in determining shift frequency $f_{sh}$. The $f_{sh}$_min and the $f_{sh}$_max may be fixed by standard, or may be arbitrarily set within the range of that standard by encoder.

First, at step S10, the minimum value min serving as internal variable is set to infinite value, and frequency f is set to $f_{sh}$_min as initial value.

Then, at step S11, distance $d_f$ between vectors in the case where F_high(f) and F_low'(f) are respectively regarded as vector is calculated in accordance with the following formula (3). Here, in the formula (3), i indicates index of discrete frequency, and $n_f$ indicates the number of samples up to frequency f. In addition, S_low'(i) indicates magnitude of F_low'(f) at discrete frequency i, and S_high(i) indicates magnitude of F_high(f) at discrete frequency i.

$$df = \frac{\sum_{i=2fc-f}^{2fc} |S\_low'(i) - S\_high(i)|^2}{n_f} \quad (3)$$

Figure 6:
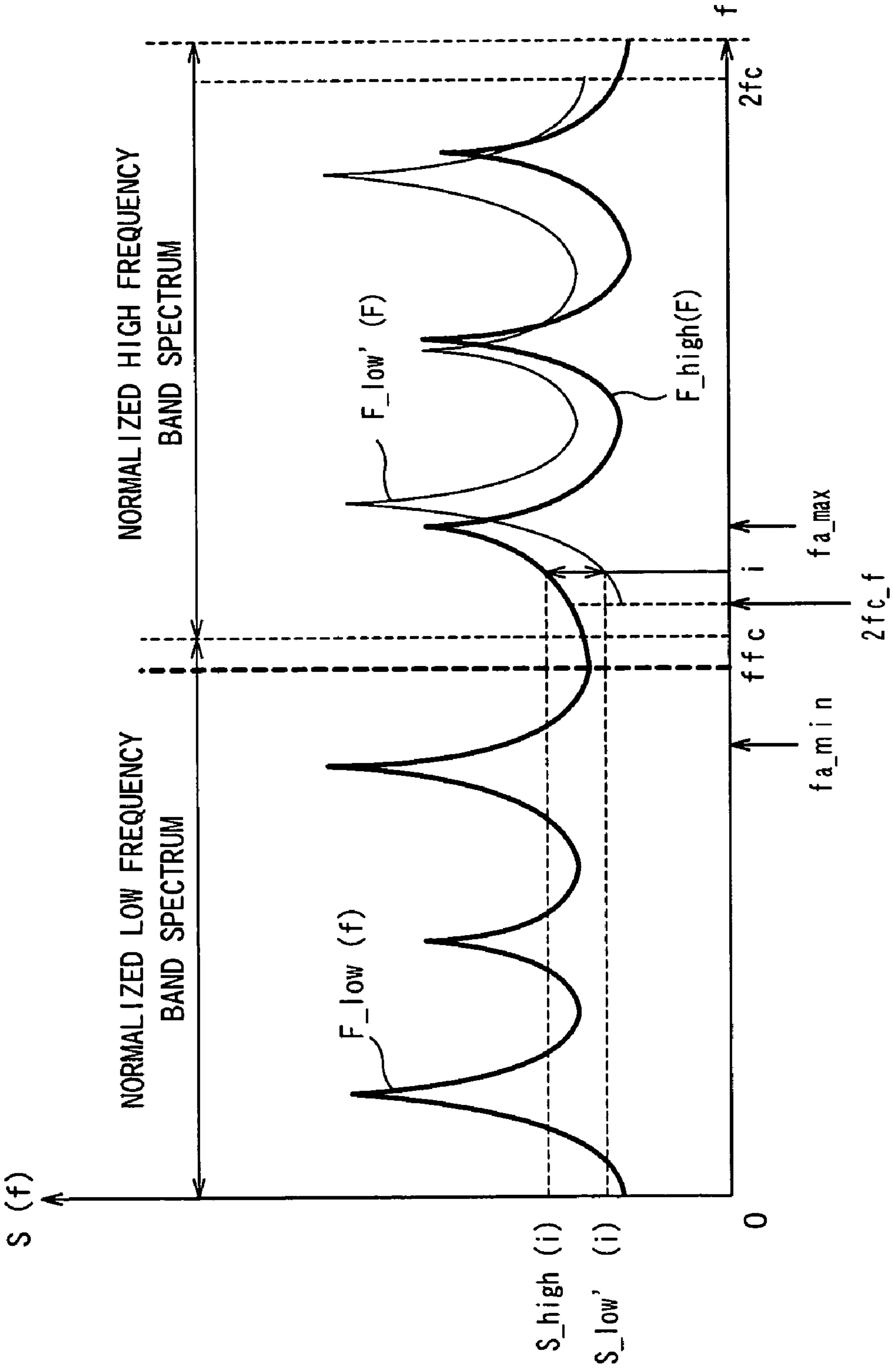
FIG. 6 is a view showing, in a model form, the state for determining shift frequency.

Namely, as shown in a model form in FIG. 6, square of difference of magnitude between F_low'(f) and F_high(f) (=|S_low'(i)−S_high(i)|$^2$) is cumulatively added with respect to the range from discrete frequency $2f_c$−f to discrete frequency 2f to allow the added value thus obtained to be distance $d_f$.

Returning to FIG. 5 for a second time, at step S12, whether or not distance $d_f$ is less than the minimum value min is discriminated. In the case where the distance $d_f$ is less than the minimum value min (Yes), the minimum value min is updated into $d_f$ at the subsequent step S13 to preserve (store) frequency f at that time as shift frequency $f_{sh}$. On the other hand, in the case where the distance $d_f$ is the minimum value min or more (No), processing proceeds to step S14.

At the step S14, whether or not the frequency f falls within the range from $f_{sh}$_min to $f_{sh}$_max is discriminated. In the case where the frequency f falls within the range from $f_{sh}$_min to $f_{sh}$_max (Yes), the frequency f is incremented at step S15 to return to the step S11. On the other hand, in the case where the frequency f does not fall within the range from $f_{sh}$_min to $f_{sh}$_max (No), shift frequency $f_{sh}$ preserved (stored) at present is established to include that shift frequency into the above-described high frequency band signal generation information.

As explained above, the signal encoding apparatus 10 in this embodiment limits inputted time series signal to a low frequency band signal having cut-off frequency $f_c$ or less to include this low frequency band signal into code train for outputting encoded low frequency band code train.

Moreover, the signal encoding apparatus 10 adaptively determines aliasing frequency $f_a$, shift frequency $f_{sh}$, and/or tone•noise synthesis information r used for generation of high frequency band signal at the decoding side to include, as high frequency signal generation information, these information into code train to be outputted along with high frequency band spectrum envelope information.

Figure 7:
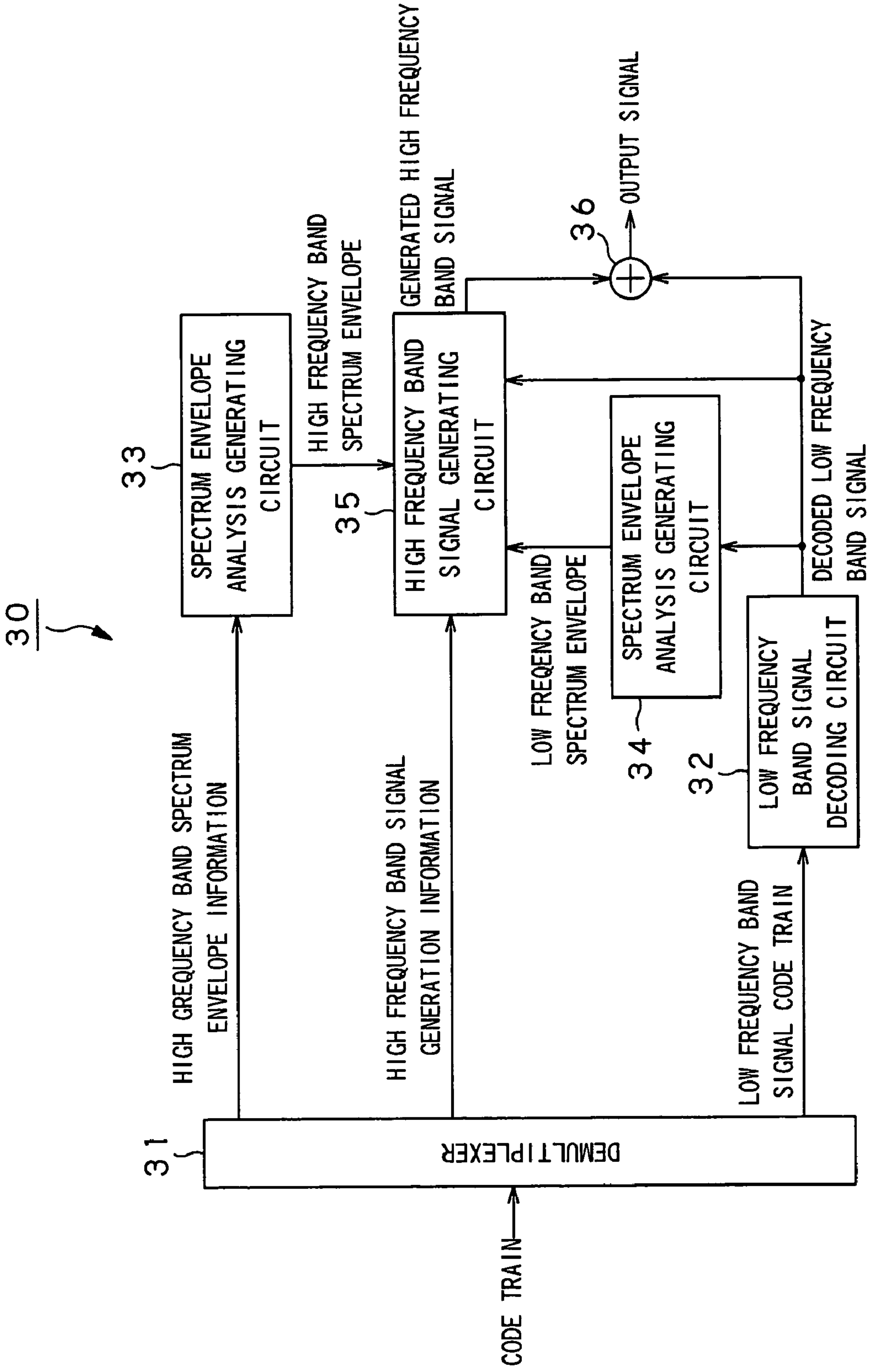
FIG. 7 is a view for explaining outline of the configuration of a signal decoding apparatus in this embodiment.

Subsequently, outline of the configuration of a signal decoding apparatus in this embodiment which generates high frequency band signal while using the above-described high frequency band signal generation information, etc. is shown in FIG. 7. As shown in FIG. 7, the signal decoding apparatus 30 in this embodiment is composed of a demultiplexer 31, a low frequency band signal decoding circuit 32, a spectrum envelope generating circuit 33, a spectrum envelope analysis generating circuit 34, a high frequency band signal generating circuit 35, and an adding circuit 36.

The demultiplexer 31 separates the code train inputted from the signal encoding apparatus 10 (FIG. 1) into three information of low frequency band signal code train, high frequency band spectrum envelope information and high frequency band signal generation information to respectively deliver them to the low frequency band signal decoding circuit 32, the spectrum envelope generating circuit 33 and the high frequency band signal generating circuit 35.

The low frequency band signal decoding circuit 32 decodes low frequency band signal code train delivered from the demultiplexer 31 to deliver decoded low frequency band signal thus obtained to the spectrum envelope analysis generating circuit 34, the high frequency band signal generating circuit 35 and the adding circuit 36.

The spectrum envelope generating circuit 33 generates high frequency band spectrum envelope on the basis of the high frequency band spectrum envelope information delivered from the demultiplexer 31 to deliver this high frequency band spectrum envelope to the high frequency band signal generating circuit 35.

The spectrum envelope analysis generating circuit 34 analyzes the decoded low frequency band signal delivered from the low frequency band signal decoding circuit 32 to generate low frequency band spectrum envelope to deliver this low frequency band spectrum envelope to the high frequency band signal generating circuit 35.

The high frequency band signal generating circuit 35 generates high frequency band signal in a manner as described later by using the high frequency band spectrum envelope, the low frequency band spectrum envelope, the low frequency band signal and the high frequency band signal generation information to deliver the generated high frequency band signal thus obtained to the adding circuit 36.

The adding circuit 36 adds the decoded low frequency band signal delivered from the low frequency band signal decoding circuit 32 and the generated high frequency band signal delivered from the high frequency band signal generating circuit 35 to output final time series signal.

Figure 8:
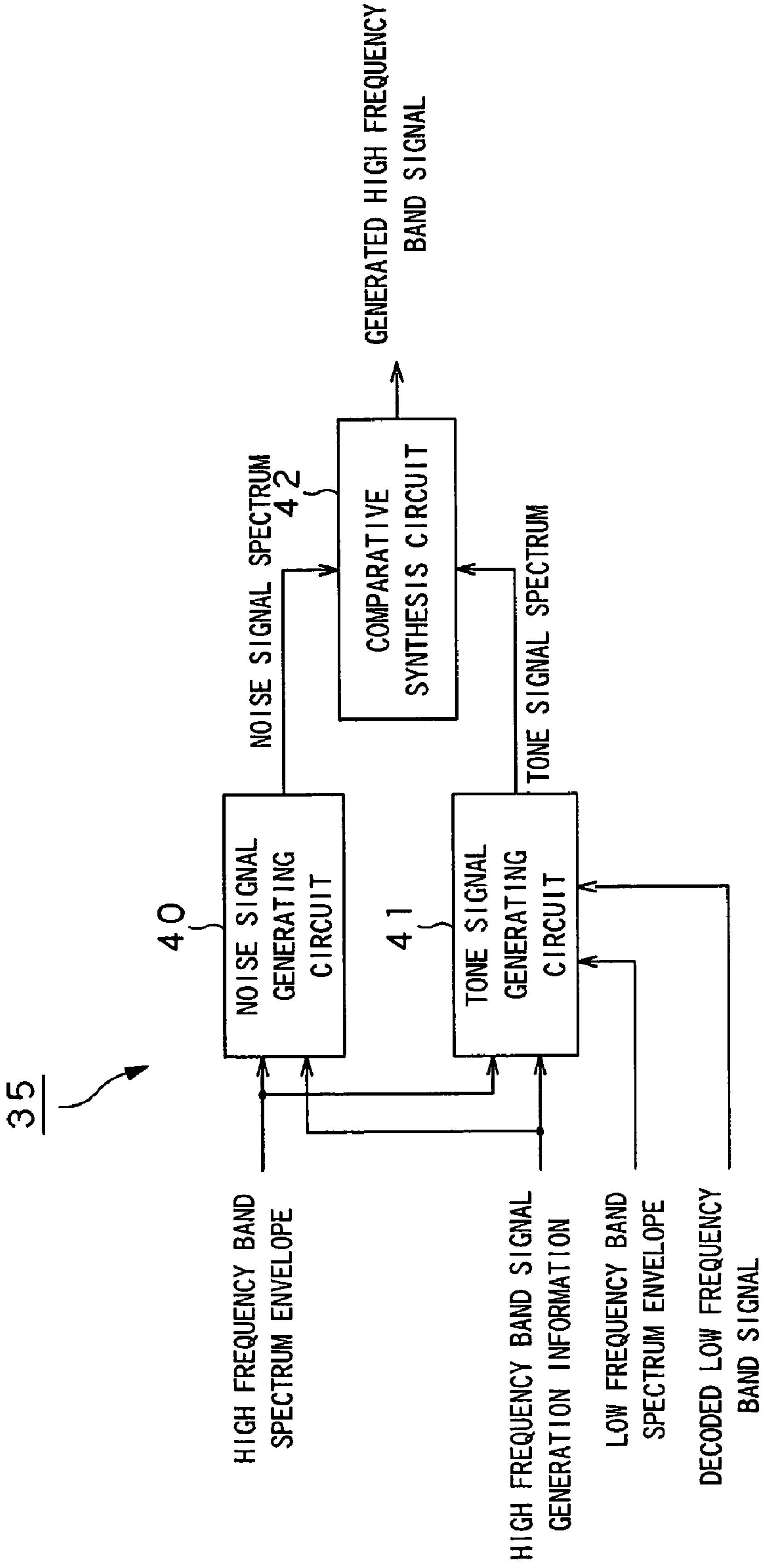
FIG. 8 is a view schematically showing internal configuration of high frequency band signal generating circuit in the signal decoding apparatus.

Here, the internal configuration of the above-described high frequency band signal generating circuit 35 is schematically shown in FIG. 8. As shown in FIG. 8, the high frequency band signal generating circuit 35 is composed of a noise signal generating circuit 40, a tone signal generating circuit 41, and a comparative synthesis circuit 42.

The noise signal generating circuit 40 generates noise signal by using high frequency band spectrum envelope and high frequency band signal generation information. This noise signal is a signal in which high frequency band spectrum envelope is caused to be amplitude on the frequency area, and phase is random as indicated by the following formula (4). In this case, in the formula (4), k indicates discrete frequency, NS indicates noise spectrum which is complex number, Re{ } indicates real part of complex number, Im { } indicates imaginary part of complex number, and r indicates the above-described tone•noise mixture information. In addition, E indicates high frequency band spectrum envelope, θr indicates random phase, and RND( ) indicates random number uniformly distributed within the range from 0 to 1.

$$Re\{NS(k)\}=r\times E(k)\times\cos(\theta r)$$

$$Im\{NS(k)\}=r\times E(k)\times\sin(\theta r)$$

$$\theta r=2\times\pi\times RND(\,) \tag{4}$$

The noise signal generating circuit 40 delivers noise signal spectrum obtained by the formula (4) to the comparative synthesis circuit 42.

On the other hand, the tone signal generating circuit 41 generates tone signal spectrum in a manner as described later by using the high frequency band spectrum envelope, the high frequency band signal generation information, the low frequency band spectrum envelope and the decoded low frequency band signal. The tone signal generating circuit 41 delivers the generated tone signal spectrum to the comparative synthesis circuit 42.

The comparative synthesis circuit 42 makes comparison between magnitudes on the frequency axis with respect to noise signal spectrum delivered from the noise signal generating circuit 40 and tone signal spectrum delivered from the tone signal generating circuit 41 to select larger spectrum every discrete frequency to generate synthesized spectrum. Further, the comparative synthesis circuit 42 allows this synthesized spectrum to undergo Inverse Discrete Fourier Transform (IDFT) to transform it into time series signal to further implement windowing thereto to output, as the above-described generated high frequency band signal, signal which has been overlap-synthesized with output signal of previous frame.

Here, practical processing procedure at the tone signal generating circuit 41 will be explained by using FIGS. 9 to 12. This tone signal generating circuit 41 can generate tone signal spectrum on the basis of aliasing frequency $f_a$ or shift frequency $f_{sh}$ included in high frequency band signal generation information.

Figure 9:
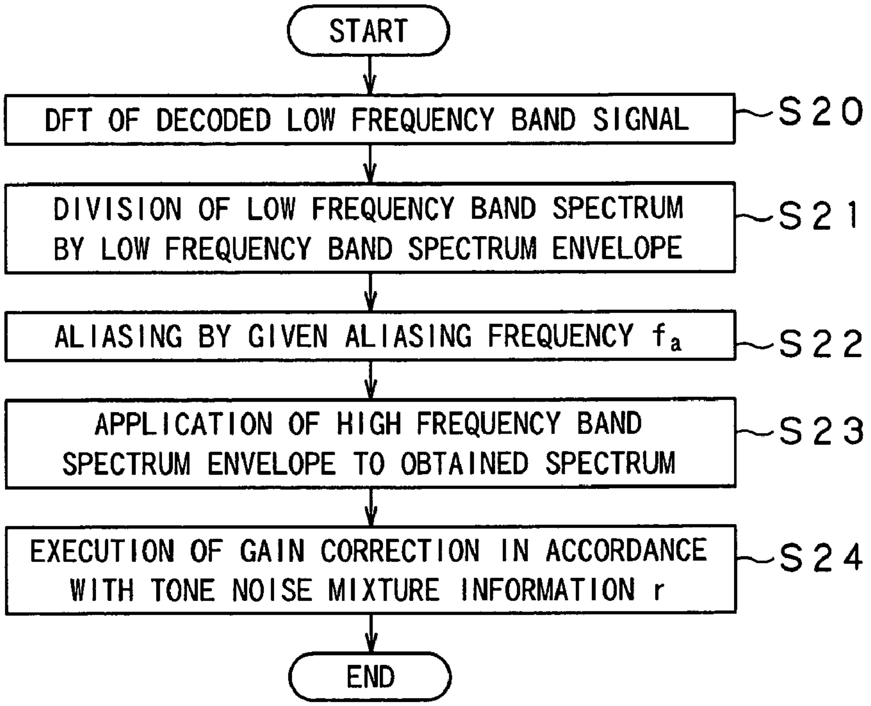
FIG. 9 is a flowchart for explaining processing procedure in the case where tone signal spectrum is generated by making use of aliasing frequency at tone signal generating circuit within the high frequency band signal generating circuit.

First, processing procedure in the case where tone signal spectrum is generated by making use of aliasing frequency $f_a$ is shown in FIG. 9. At step S20 of FIG. 9, decoded low frequency band signal is caused to undergo Discrete Fourier Transform (DFT) to generate decoded low frequency band spectrum. At the subsequent step S21, the decoded low frequency band spectrum thus obtained is divided by low frequency band spectrum envelope so that it is normalized.

Subsequently, at step S22, the normalized low frequency band spectrum is caused to undergo aliasing linearly symmetrically with aliasing frequency $f_a$ included in the high frequency band signal generation information being as center.

Figure 10:
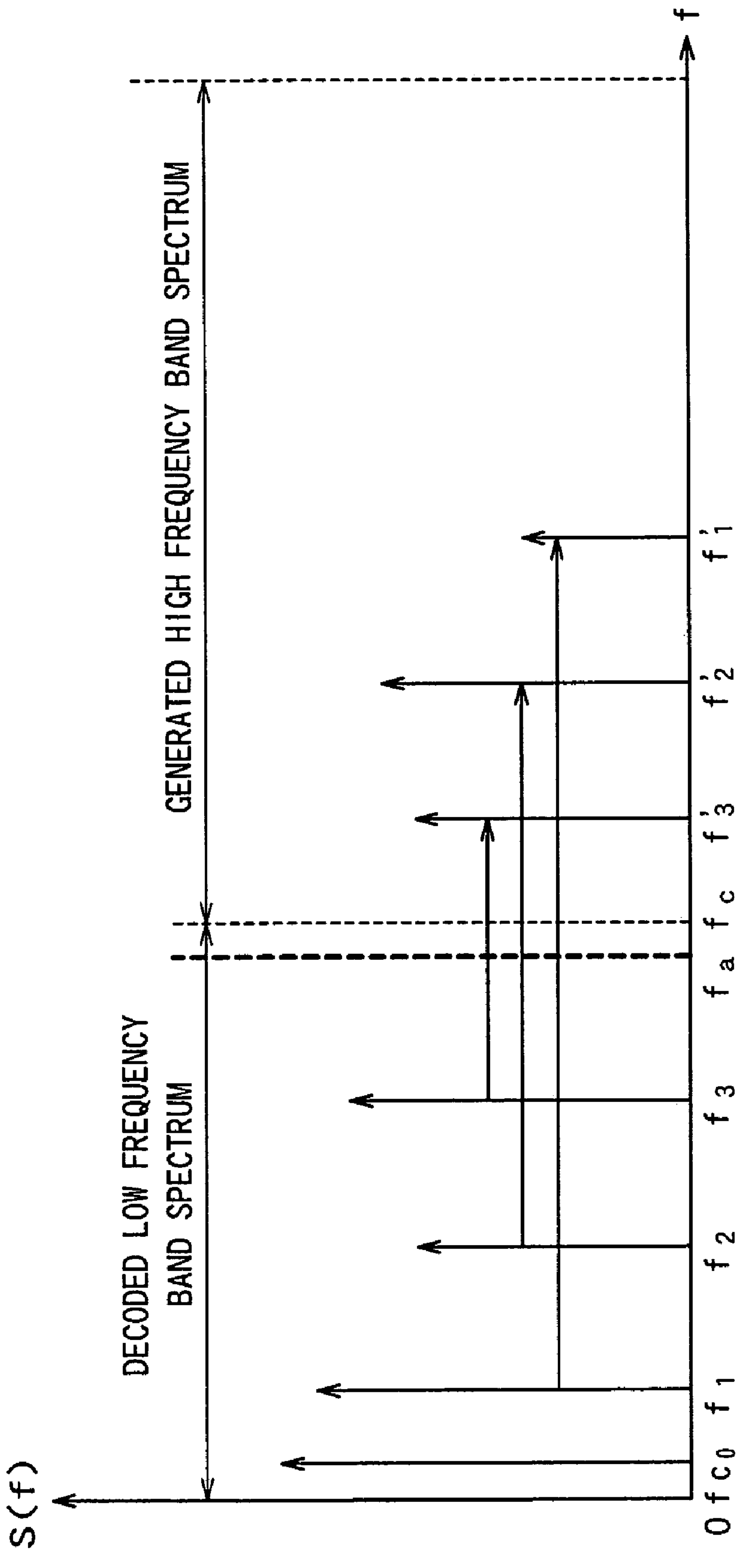
FIG. 10 is a view showing, in a model form, the state of aliasing of normalized low frequency band spectrum at the tone signal generating circuit.

The state of aliasing of this normalized low frequency band spectrum is shown in a model form in FIG. 10. It is to be noted that only spectrum components of peak positions at normalized low frequency band spectrum are represented in FIG. 10. When frequencies of spectrum components of peak positions are assumed to be respectively $f_1$, $f_2$, $f_3$ from low frequency band, $f_1$, $f_2$, $f_3$ are caused to respectively undergo aliasing toward $f'_1$, $f'_2$, $f'_3$ by using aliasing frequency $f_a$. The relationship between the $f_n$ (n=1, 2, 3) and $f'_n$ can be represented by the formula (5) as described below.

$$fn'=fa+(fa-fn)=2\times fa-fn \tag{5}$$

Returning to FIG. 9 for a second time, at step S23, high frequency band spectrum envelope is applied to generated high frequency band spectrum which has been made by this aliasing.

Further, at step S24, correction of gain is performed by using tone•noise mixture information r included in the high frequency band signal generation information.

Figure 11:
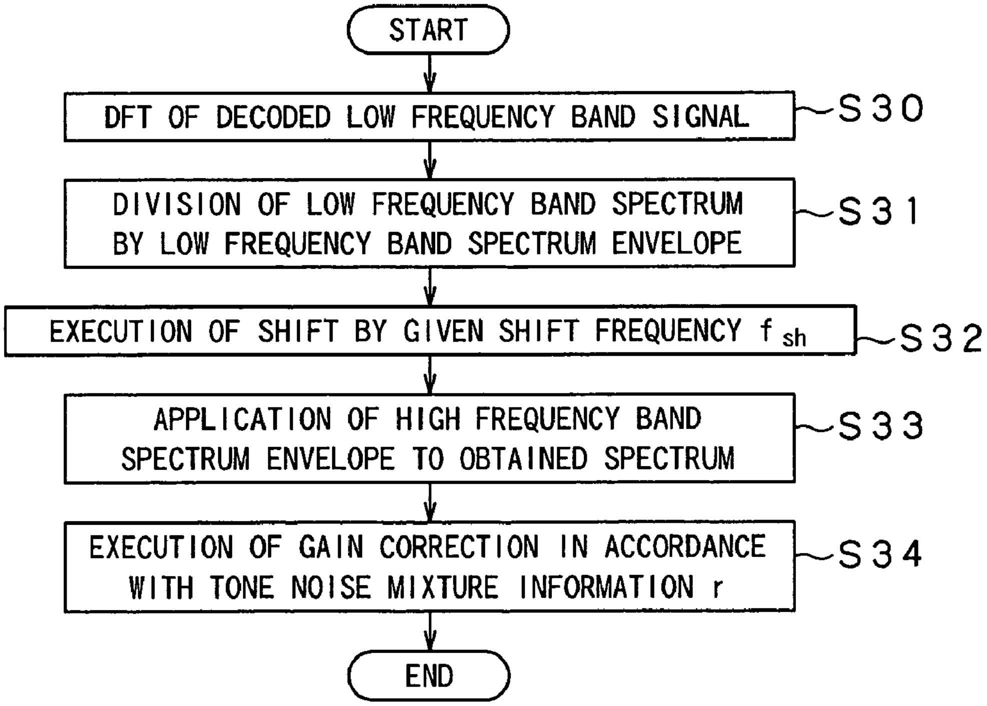
FIG. 11 is a flowchart for explaining processing procedure in the case where tone signal spectrum is generated by making use of shift frequency at tone signal generating circuit within the high frequency signal generating circuit.

Then, processing procedure in the case where tone signal spectrum is generated by making use of shift frequency $f_{sh}$ is shown in FIG. 11. At step S30 of FIG. 11, decoded low frequency band signal is caused to undergo Discrete Fourier Transform (DFT) to generate decoded low frequency band spectrum. At the subsequent step S31, the decoded low frequency band spectrum thus obtained is divided by low frequency band spectrum envelope so that it is normalized.

Subsequently, at step S32, the normalized low frequency band spectrum is shifted by $2f_c-f_{sh}$ by using shift frequency $f_{sh}$ included in the high frequency band signal generation information.

Figure 12:
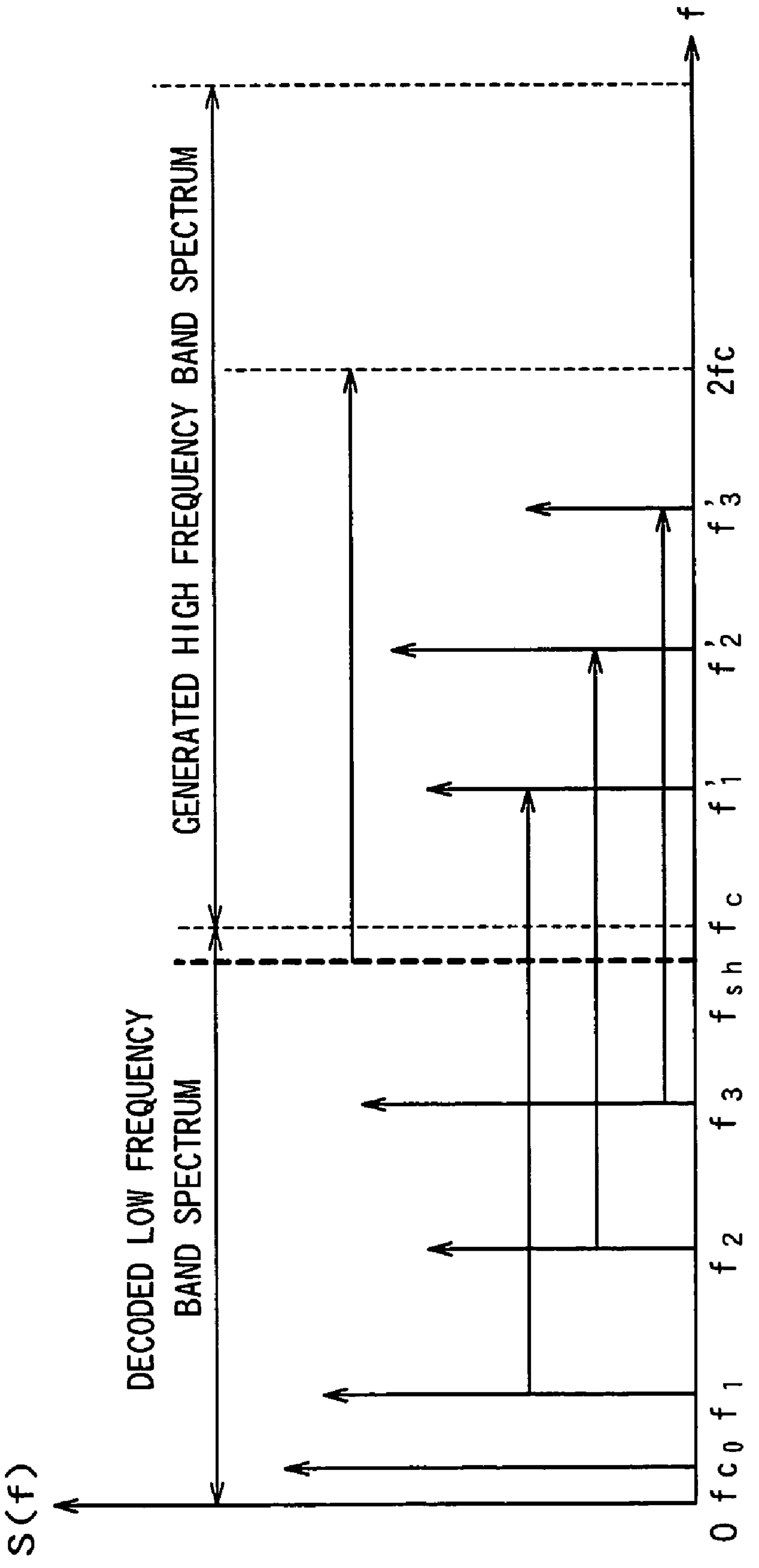
FIG. 12 is a view showing, in a model form, the state of shift of normalized low frequency band spectrum in the tone signal generating circuit.

The state of shift of this normalized low frequency band spectrum is shown in a model form in FIG. 12. It is to be noted that only spectrum components of peak positions at the normalized low frequency band spectrum are represented in this FIG. 12. When frequencies of spectrum components of peak positions are assumed to be respectively $f_1$, $f_2$, $f_3$ from low frequency band, $f_1$, $f_2$, $f_3$ are respectively shifted to $f'_1$, $f'_2$, $f'_3$ by using shift frequency $f_{sh}$. The relationship between the $f_n$ (n=1, 2, 3) and $f'_n$ can be represented by the formula (6) as described below.

$$fn'=fn+(2\cdot fc-fsh) \quad (6)$$

Returning to FIG. 11 for a second time, at step S33, high frequency band spectrum envelope is applied to the generated high frequency band spectrum which has been made by this alasing.

Further, at step S34, correction of gain is performed by using tone•noise synthesis information r included in the high frequency band signal generation information.

As explained above, the signal decoding apparatus 30 in this embodiment generates high frequency band signal from low frequency band signal by using high frequency band signal generation information including aliasing frequency $f_a$, shift frequency $f_{sh}$, and tone•noise mixture information r, and high frequency band spectrum envelope which are included in code train to add this generated high frequency band signal and the low frequency band signal, thereby making it possible to output time series signal extended up to high frequency band signal.

It is to be noted that while explanation has been given in the above explanation on the premise that only one of aliasing processing and shift processing is performed, both processing may be conducted in parallel every frame in the case where there is margin in processing to designate, by high frequency band generation method flag, the processing by which good result can be obtained.

Figure 13:
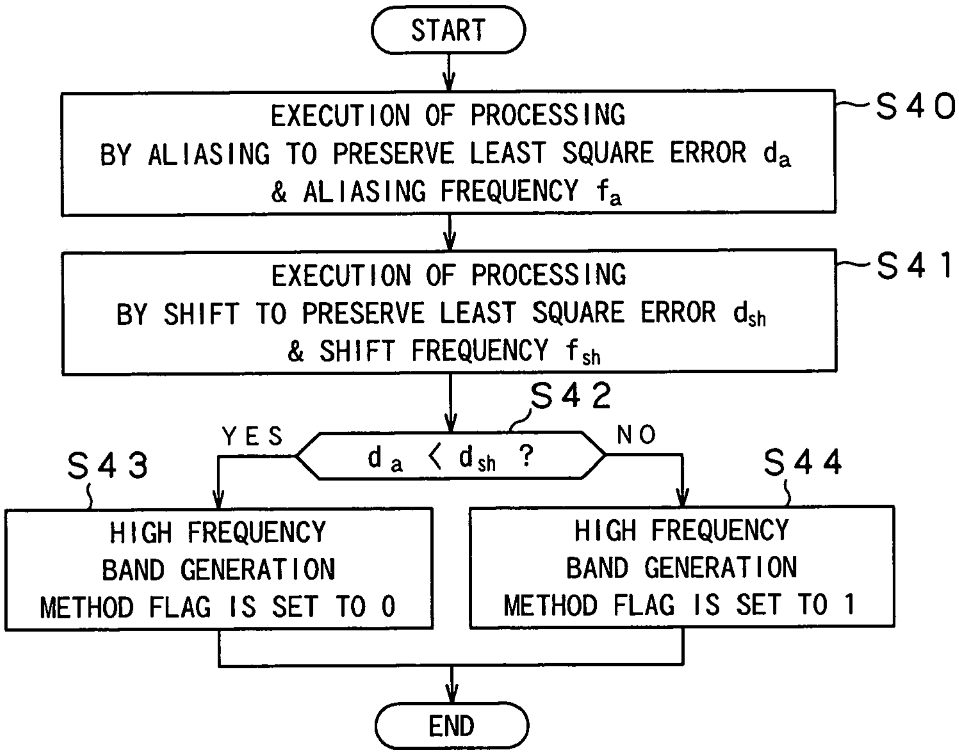
FIG. 13 is a flowchart for explaining processing procedure of signal encoding apparatus in the case where aliasing processing or shift processing is designated by high frequency band generation method flag.

The processing procedure at the signal encoding apparatus 10 in this case will be explained by using the flowchart of FIG. 13. First, at step S40, aliasing processing is performed by the procedure which has been already explained by using FIGS. 3 and 4 to preserve (store) least square error $d_a$ and the aliasing frequency $f_a$ thereof.

Figure 5:
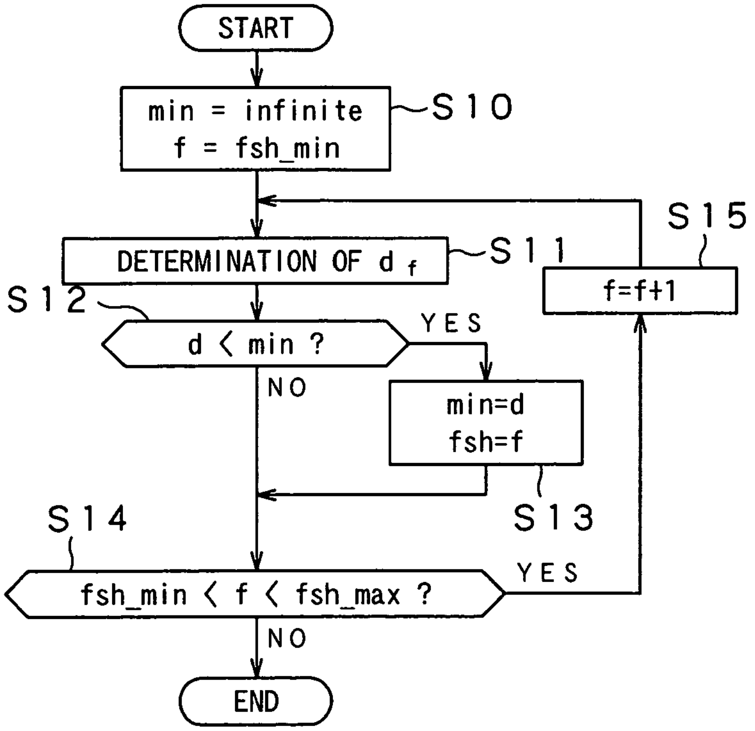
FIG. 5 is a flowchart for explaining the procedure which determines shift frequency at high frequency band signal generation information extracting circuit of the signal encoding apparatus.

Then, at step S41, shift processing is performed by the procedure which has been already explained by using FIGS. 5 and 6 to preserve (store) least square error $d_{sh}$ and the shift frequency $f_{sh}$ thereof.

Subsequently, at step S42, two least square errors are compared. Specifically, for example, whether or not least square error $d_a$ in the case where aliasing processing is performed is less than least square error $d_{sh}$ in the case where shift processing is performed is discriminated. Further, in the case where the least square error $d_a$ is less than the least square error $d_{sh}$ (Yes), it is judged that aliasing processing is better. As a result, at step S43, high frequency band generation method flag is set to 0. On the other hand, in the case where the least square error $d_a$ is the least square error $d_{sh}$ or more (No), it is judged that shift processing is better. As a result, at step S44, high frequency band generation method flag is set to 1. It is to be noted that this high frequency band generation flag can be included into the above-described high frequency band signal generation information.

Figure 14:
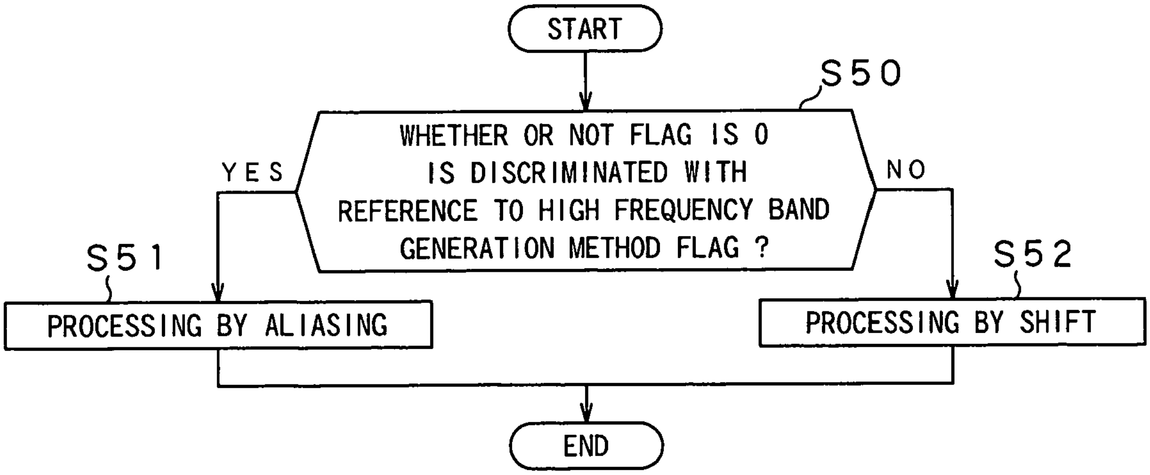
FIG. 14 is a flowchart for explaining processing procedure of signal decoding apparatus in the case where aliaing processing or shift processing is designated by high frequency band generation method flag.

Subsequently, the processing procedure at the signal decoding apparatus 30 will be explained by using the flowchart of FIG. 14. First, at step S50, whether or not flag is 0 is discriminated with reference to high frequency band generation method flag included in high frequency band generation information. In the case where the flag is 0 (Yes), generation of high frequency band spectrum is performed by aliasing processing at step S51. On the other hand, in the case where the flag is 1 (No), generation of high frequency band spectrum is performed by shift processing at step S52.

Figure 15:
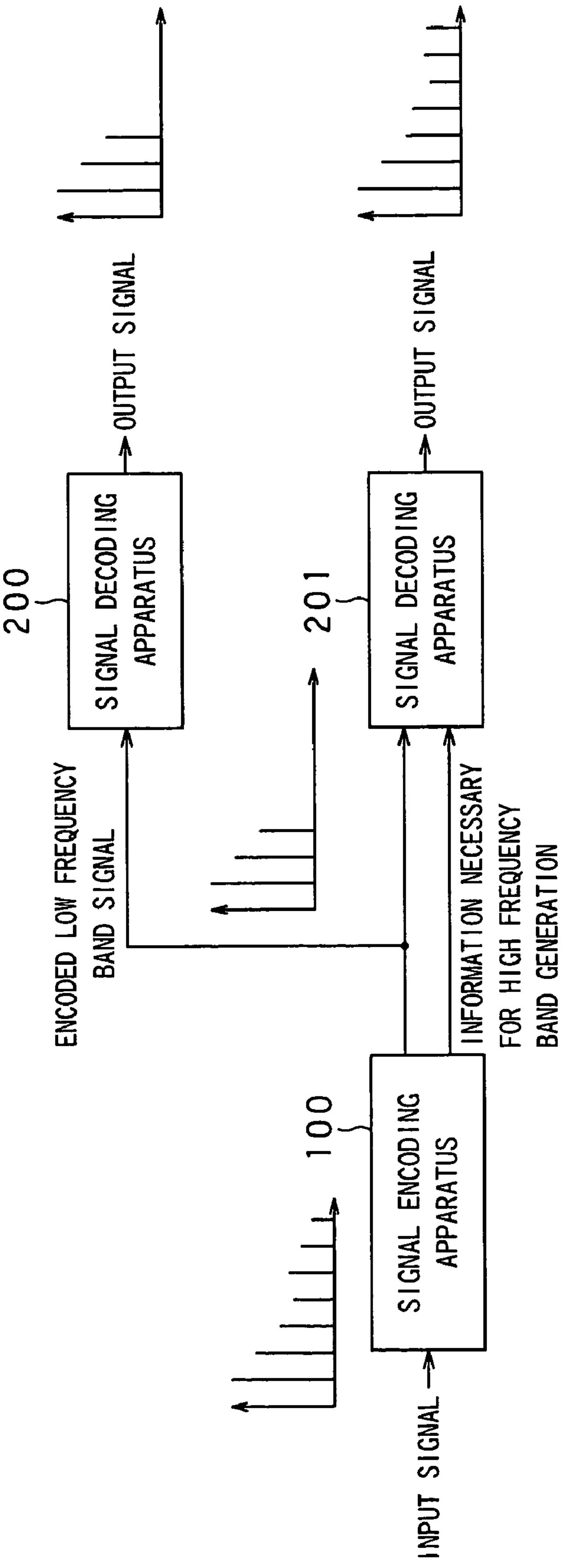
FIG. 15 is a view showing the entire configuration of system to which the signal encoding apparatus and the signal decoding apparatus are applied.

Here, the configuration of the entirety of the system to which the signal encoding apparatus 10 and the signal decoding apparatus 30 in the above-described embodiments are applied is shown in FIG. 15.

Figure 16A:
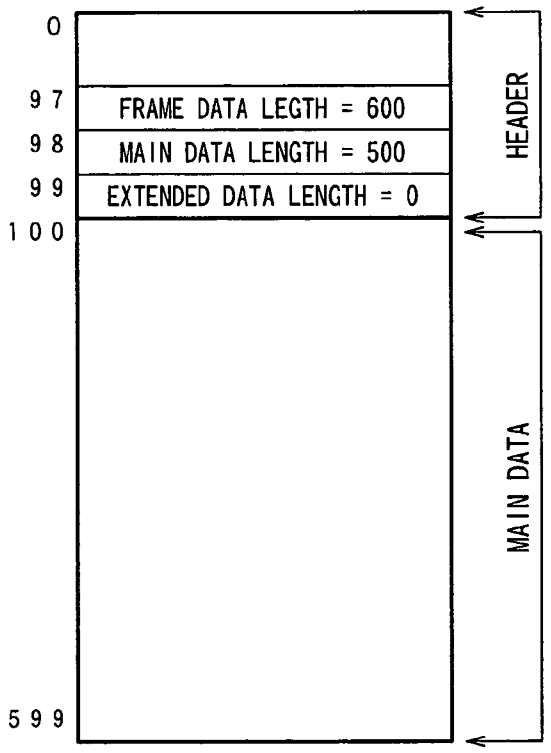

In FIG. 15, a signal decoding apparatus 200 serves to decode code trains caused to undergo transmission between conventional encoding/decoding systems. An example of format of data train that the signal decoding apparatus 200 of the conventional standard handles is shown in FIG. 16A. As shown in FIG. 16A, areas where frame data length, main data length and extended data length are recorded exist at header portion from, e.g., address 0 to address 99, wherein 500 except for header length 100 among frame data length 600 is assigned to main data, and code trains of the conventional standard are recorded in this area.

Figure 16B:
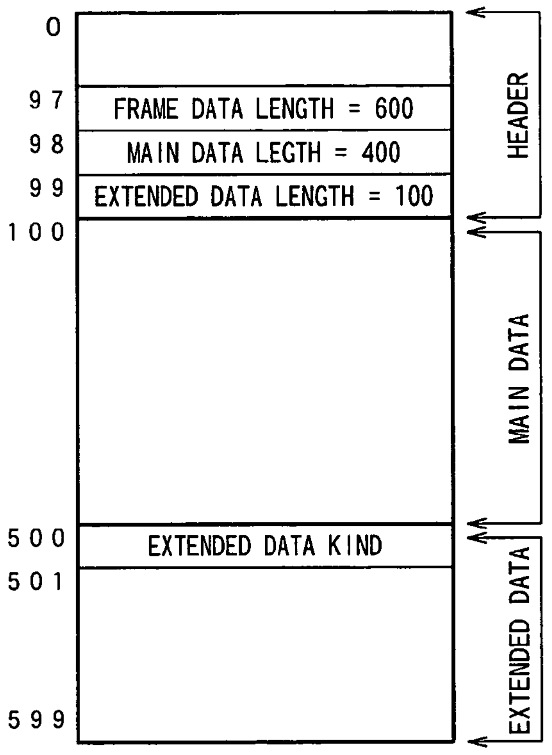

The signal encoding apparatus 100 has the configuration similar to the above-described signal encoding apparatus 10, and serves to encode, on the basis of time series signal, code train of the conventional frequency band limited signal and information for generating, at the time of decoding, band except for the limited frequency band. An example of format of data train outputted from the signal encoding apparatus 100 is shown in FIG. 16B. As shown in FIG. 16B, areas where frame data length, main data length and extended data length are recorded exist at header portion from address 0 to address 99. In addition, 400 is assigned to main data among frame data 600, and area of 100 is assigned to extended data.

A signal decoding apparatus 201 has the configuration similar to the above-described signal decoding apparatus 30, and serves to decode main data, and to also decode areas succeeding to address 501 in the case where extended data kind of address 500 of FIG. 16B is the standard of this signal decoding apparatus 201. Thus, the signal decoding apparatus 201 decodes frequency band limited code train on the basis of code train encoded by the signal encoding apparatus 100 and band generation information, and generates signal of new frequency band on the basis of the band generation information to superimpose both signals to have ability to obtain final time series signal.

On the other hand, since the above-described signal decoding apparatus 200 of the conventional standard cannot understand this extended data area, but is designed in such a manner to neglect this extended data area, it decodes only main data in a manner conventionally described to have ability to obtain frequency band limited time series signal.

While the invention has been described in accordance with certain preferred embodiments thereof illustrated in the accompanying drawings and described in the above description in detail, it should be understood by those ordinarily skilled in the art that the invention is not limited to the embodiments, but various modifications, alternative constructions or equivalents can be implemented without departing from the scope and spirit of the present invention as set forth and defined by appended claims.

For example, while it has been explained in the above-described embodiments that low frequency band signal which has been band-limited by low-pass filter is orthogonally transformed every predetermined frame and is encoded, the present invention is not limited to such implementation, but may employ such an approach to orthogonally transform inputted time series signal to extract low frequency band spectrum to encode the extracted low frequency band spectrum.

In addition, while the present invention has been explained as the configuration of hardware in the above-described embodiments, the present invention is not limited to such implementation, but an arbitrary processing may be also realized by allowing CPU (Central Processing Unit) to execute computer program. In this case, computer program may be provided in the state where it is recorded with respect to recording medium, or may be also provided by performing transmission thereof through other transmission media such as Internet.

INDUSTRIAL APPLICABILITY

In accordance with the above-described present invention, spectrum of limit band corresponding to a predetermined frequency band of inputted time series signal is encoded at the encoding side, and mapping information indicating a method of mapping is adaptively generated in order to determine time series signal of frequency band to be extended at the decoding side on the basis of the mapping of the spectrum of the limit band to decode the encoded spectrum of the limit band at the decoding side to generate time series signal of limit band, and to generate time series signal of extension band to be extended from the spectrum of the limit band on the basis of the mapping information to add the time series signal of the limit band and the time series signal of the extension band to output added signal, thereby making it possible to generate optimum harmonic wave at frequency band which is extended at the time of decoding even in the case where complicated harmonic wave exists.

The invention claimed is:

1. A signal encoding apparatus adapted for orthogonally transforming an inputted time series signal to encode the time series signal thus transformed, the signal encoding apparatus comprising:

encoding means for encoding spectrum of a limit band corresponding to a predetermined frequency band of the inputted time series signal, mapping information generating means for adaptively generating mapping information indicating a method of mapping in order to determine a time series signal of a frequency band to be extended during decoding on the basis of the mapping of the spectrum of the limit band, and output means for outputting the encoded spectrum of the limit band and the mapping information, wherein the frequency band to be extended is a frequency band higher than the predetermined frequency band;

wherein the mapping is aliasing processing which allows the spectrum of the limit band to undergo aliasing at a certain position on the frequency axis, wherein the mapping information generating means adaptively determines aliasing position to generate the mapping information; and wherein the mapping information generating means normalizes the spectrum of limit band by spectrum envelope thereof to adaptively determine a position where the normalized spectrum of limit band is caused to undergo aliasing to generate the mapping information.

2. A signal encoding apparatus adapted for orthogonally transforming an inputted time series signal to encode the time series signal thus transformed, the signal encoding apparatus comprising:

encoding means for encoding spectrum of a limit band corresponding to a predetermined frequency band of the inputted time series signal, mapping information generating means for adaptively generating mapping information indicating a method of mapping in order to determine a time series signal of a frequency band to be extended during decoding on the basis of the mapping of the spectrum of the limit band, and output means for outputting the encoded spectrum of the limit band and the mapping information, wherein the frequency band to be extended is a frequency band higher than the predetermined frequency band;

wherein the mapping is aliasing processing which allows the spectrum of the limit band to undergo aliasing at a certain position on the frequency axis, wherein the mapping information generating means adaptively determines aliasing position to generate the mapping information; and wherein the mapping information generating means calculates distance between the spectrum of the limit band which has been caused to undergo aliasing at a certain position on the frequency axis and spectrum of extension band to be extended during decoding to determine the aliasing position on the basis of the distance.

3. The signal encoding apparatus as set forth in claim 2, wherein the distance is square sum of level difference between spectrum components of the limit band at respective frequencies and the spectrum of the extension band.

4. A signal encoding apparatus adapted for orthogonally transforming an inputted time series signal to encode the time series signal thus transformed, the signal encoding apparatus comprising:

encoding means for encoding spectrum of a limit band corresponding to a predetermined frequency band of the inputted time series signal, mapping information generating means for adaptively generating mapping information indicating a method of mapping in order to determine a time series signal of a frequency band to be extended during decoding on the basis of the mapping of the spectrum of the limit band, and output means for outputting the encoded spectrum of the limit band and the mapping information, wherein the frequency band to be extended is a frequency band higher than the predetermined frequency band;

wherein the mapping is parallel displacement processing which performs parallel displacement of the spectrum of the limit band at a certain position on the frequency axis, wherein the mapping information generating means adaptively determines parallel displacement position to generate the mapping information; and wherein the mapping information generating means normalizes the spectrum of the limit band by the spectrum envelope thereof to adaptively determine a position where the normalized spectrum of the limit band is caused to undergo parallel displacement to generate the mapping information.

5. A signal encoding apparatus adapted for orthogonally transforming an inputted time series signal to encode the time series signal thus transformed, the signal encoding apparatus comprising:

encoding means for encoding spectrum of a limit band corresponding to a predetermined frequency band of the inputted time series signal, mapping information generating means for adaptively generating mapping information indicating a method of mapping in order to determine a time series signal of a frequency band to be extended during decoding on the basis of the mapping of the spectrum of the limit band, and output means for outputting the encoded spectrum of the limit band and the mapping information, wherein the frequency band to be extended is a frequency band higher than the predetermined frequency band;

wherein the mapping is parallel displacement processing which performs parallel displacement of the spectrum of the limit band at a certain position on the frequency axis, wherein the mapping information generating means adaptively determines parallel displacement position to generate the mapping information; and wherein the mapping information generating means calculates distance between the spectrum of the limit band which has been caused to undergo parallel displacement at a certain position on the frequency axis and spectrum of extension band to be extended during decoding to determine the parallel displacement position on the basis of the distance.

6. A signal encoding apparatus adapted for orthogonally transforming an inputted time series signal to encode the time series signal thus transformed, the signal encoding apparatus comprising:

encoding means for encoding spectrum of a limit band corresponding to a predetermined frequency band of the inputted time series signal, mapping information generating means for adaptively generating mapping information indicating a method of mapping in order to determine a time series signal of a frequency band to be extended during decoding on the basis of the mapping of the spectrum of the limit band, and output means for outputting the encoded spectrum of the limit band and the mapping information, wherein the frequency band to be extended is a frequency band higher than the predetermined frequency band;

wherein the mapping is aliasing processing for allowing the spectrum of limit band to undergo aliasing at a certain position on the frequency axis, or parallel displacement processing for performing parallel displacement of the spectrum of the limit band at a certain position on the frequency axis, and wherein the mapping information generating means adaptively determines the aliasing processing or the parallel displacement processing in accordance with the state of inputted time series signal to generate the mapping information.

7. A signal decoding apparatus comprising:

input means for inputting encoded spectrum of a limit band corresponding to a predetermined frequency band of a time series signal inputted during encoding, and mapping information indicating a method of mapping adaptively generated in order to determine a time series signal of a frequency band to be extended during decoding on the basis of mapping of the spectrum of the limit band, decoding means for decoding the encoded spectrum of the limit band to generate a time series signal of limit band, band extending means for determining spectrum of extension band to be extended from the spectrum of the limit band on the basis of the mapping information to inverse-orthogonally transform the spectrum of the extension band to generate a time series signal of extension band, and outputting means for adding the time series signal of the limit band and the time series signal of the extension band to output added signal.

8. The signal decoding apparatus as set forth in claim 7, wherein the mapping is aliasing processing which allows the spectrum of the limit band to undergo aliaing at a certain position on the frequency axis, and wherein the band extending means determines the spectrum of the extension band on the basis of information indicating aliasing position inputted from the encoding side.

9. The signal decoding apparatus as set forth in claim 8, wherein the band extending means normalizes the spectrum of the limit band by the spectrum envelope thereof to allow the normalized spectrum of the limit band to undergo aliasing on the basis of information indicating aliasing position inputted from the encoding side to determine the spectrum of the extension band.

10. The signal decoding apparatus as set forth in claim 7, wherein the mapping is parallel displacement processing which performs parallel displacement of the spectrum of the limit band at a certain position on the frequency axis, and wherein the band extending means determines the spectrum of the extension band on the basis of information indicating parallel displacement position inputted from the encoding side.

11. The signal decoding apparatus as set forth in claim 10, wherein the band extending means normalizes the spectrum of the limit band by the spectrum envelope thereof to perform parallel displacement of the normalized spectrum of the limit band on the basis of information indicating parallel displacement position inputted from the encoding side to determine the spectrum of the extension band.

12. The signal decoding apparatus as set forth in claim 7, wherein the mapping is aliasing processing for allowing the spectrum of the limit band to undergo aliasing at a certain position on the frequency axis, or parallel displacement processing for performing parallel displacement of the spectrum of the limit band at a certain position on the frequency axis, and wherein the band extending means selects the aliasing processing or the parallel displacement processing on the basis of select information which has been set in accordance with the state of inputted time series signal to determine the spectrum of the extension band.

13. The signal decoding apparatus as set forth in claim 7, wherein the frequency band to be extended is a band higher than the predetermined frequency band.

14. A signal decoding method comprising:

an input step of inputting encoded spectrum of limit band corresponding to a predetermined frequency band of a time series signal inputted during encoding, and mapping information indicating a method of mapping adaptively generated in order to determine a time series signal of a frequency band to be extended during decoding on the basis of mapping of the spectrum of the limit band, a decoding step of decoding the encoded spectrum of the limit band to generate a time series signal of limit band, a band extension step of determining spectrum of extension band to be extended from the spectrum of the limit band on the basis of the mapping information to inverse-orthogonally transform the spectrum of the extension band to generate a time series signal of extension band, and an output step of adding the time series signal of the limit band and the time series signal of the extension band to output added signal.

15. A computer readable recording medium adapted so that there is recorded program for allowing computer to execute a predetermined processing, the program including:

an input step of inputting encoded spectrum of limit band corresponding to a predetermined frequency band of a time series signal inputted during encoding, and mapping information indicating a method of mapping adaptively generated in order to determine a time series signal of a frequency band to be extended during decoding on the basis of mapping of the spectrum of the limit band, a decoding step of decoding the encoded spectrum of the limit band to generate a time series signal of limit band, a band extension step of determining spectrum of an extension band to be extended from the spectrum of the limit band on the basis of the mapping information to inverse-orthogonally transform the spectrum of the extension band to generate a time series signal of extension band, and an output step of adding the time series signal of the limit band and the time series signal of the extension band to output added signal.

* * * * *